United States Patent
Nakagawa

(10) Patent No.: US 7,560,301 B2
(45) Date of Patent: Jul. 14, 2009

(54) COATING LIQUID FOR FORMING ORGANIC LAYERED FILM, METHOD OF MANUFACTURING FIELD EFFECT TRANSISTOR, AND FIELD EFFECT TRANSISTOR

(75) Inventor: Tohru Nakagawa, Osaka (JP)

(73) Assignee: Panasonic Corporation, Osaka (JP)

( * ) Notice: Subject to any disclaimer, the term of this patent is extended or adjusted under 35 U.S.C. 154(b) by 150 days.

(21) Appl. No.: 10/599,096

(22) PCT Filed: Aug. 18, 2005

(86) PCT No.: PCT/JP2005/015063

§ 371 (c)(1),
(2), (4) Date: Sep. 19, 2006

(87) PCT Pub. No.: WO2006/019133

PCT Pub. Date: Feb. 23, 2006

(65) Prior Publication Data

US 2007/0215902 A1   Sep. 20, 2007

(30) Foreign Application Priority Data

Aug. 20, 2004  (JP) ............................ 2004-240468

(51) Int. Cl.
H01L 51/40 (2006.01)
(52) U.S. Cl. .......................... 438/99; 438/761; 257/40; 257/66; 257/72; 257/192
(58) Field of Classification Search ................... 257/40, 257/66, 72, 192; 438/99, 761
See application file for complete search history.

(56) References Cited

U.S. PATENT DOCUMENTS 6,911,773 B2 * 6/2005 Seki ............................ 313/506

(Continued)

FOREIGN PATENT DOCUMENTS

CN   1309409 A   8/2001

(Continued)

OTHER PUBLICATIONS

Nakagawa et al., "Atomic force microscope for chemical sensing", J. Vac. Sci. Technol. B 12(3), May/Jun. 1994, pp. 2215-2218.

(Continued)

Primary Examiner—Matthew Smith
Assistant Examiner—Colleen E Rodgers
(74) Attorney, Agent, or Firm—Hamre, Schumann, Mueller & Larson, P.C.

(57) ABSTRACT

A method of manufacturing a field effect transistor of the present invention includes: applying a coating liquid 20 containing a solvent 13 as well as first and second organic molecules 11 and 12 that have been dissolved in the solvent 13; and forming a first layer and a second layer by removing the solvent 13 contained in the coating liquid 20 that has been applied. The first layer contains the first organic molecules 11 as its main component. The second layer adjoins the first layer and contains the second organic molecules 12 as its main component. The first organic molecules 11 are a semiconductor material or a precursor of a semiconductor material. The second organic molecules 12 are an insulator material or a precursor of an insulator material. The first organic molecules 11 and the second organic molecules 12 are not compatible with each other.

6 Claims, 5 Drawing Sheets

U.S. PATENT DOCUMENTS

2003/0136964 A1  7/2003  Afzali-Ardakani et al.

FOREIGN PATENT DOCUMENTS

| | | |
|---|---|---|
| JP | 2003-518754 | 6/2003 |
| JP | 2003-258260 | 9/2003 |
| JP | 2004-179542 | 6/2004 |
| JP | 2005-243822 | 9/2005 |
| JP | 2005243822 * | 9/2005 |
| WO | 01/47043 | 6/2001 |

OTHER PUBLICATIONS

Chinese Office Action, dated Sep. 5, 2008, with English translation.

* cited by examiner

COATING LIQUID FOR FORMING ORGANIC LAYERED FILM, METHOD OF MANUFACTURING FIELD EFFECT TRANSISTOR, AND FIELD EFFECT TRANSISTOR

TECHNICAL FIELD

The present invention relates to a coating liquid for forming a layered film including an organic semiconductor layer and an organic insulating layer, a method of manufacturing a field effect transistor using the same, and a field effect transistor.

BACKGROUND ART

A field effect transistor (hereinafter also referred to as a "FET") is an electronic device in which the value of current that flows between a source electrode and a drain electrode is controlled by voltage of a gate electrode.

In this specification, a FET whose gate insulating layer and semiconductor layer each are formed of an organic material is referred to as an "organic field effect transistor" in some cases. In that FET, the semiconductor layer adjoins the gate insulating layer and functions as a channel region. A thin film made of an organic material can be formed on a substrate at around room temperature and also has mechanical flexibility. Accordingly, the organic FET can be formed on a plastic substrate that is soft and has no heat resistance. It therefore is expected to be useful as a basic component for next-generation portable information devices.

Methods of forming an organic thin film on a substrate include a vacuum vapor deposition method and a solution coating method. The solution coating method allows an organic thin film to be formed in a normal-pressure atmosphere. Hence, the solution coating method is expected to make it possible to produce an organic field effect transistor (hereinafter also referred to as an "organic FET") at lower cost as compared to the vacuum vapor deposition method in which a vacuum apparatus is used.

Various organic FETs that are produced using the solution coating method have been developed at present, but not many of them have been put into practical use yet. When an insulating layer and a semiconductor layer are to be formed by the solution coating method, a first solution in which one of an organic insulator material and an organic semiconductor material has been dissolved is applied and then is dried to form a first layer, and thereafter a second solution in which the other material has been dissolved is applied to the first layer and then is dried to form a second layer. Such a solution coating method, however, may cause mutual dissolution in some cases.

The mutual dissolution is a phenomenon that when the second solution is applied to the first layer, the first layer dissolves into the second solution. Generally, solvents that readily dissolve the organic insulator material are similar to solvents that readily dissolve the organic semiconductor material. Hence, in order to prevent the mutual dissolution from occurring, it is necessary to select a suitable combination of an organic insulator material, an organic semiconductor material, and solvents.

Examples of the conventional technique for forming an organic semiconductor layer (and an organic insulating layer) by the solution coating method include the following three techniques.

JP2003-518754A (WO01/047043) discloses a method of forming a first layer using an organic material that does not dissolve into a second solution. In the patent document, for instance, after a xylene or chloroform solution in which polyalkylthiophene has been dissolved is applied to a base material to form a semiconductor film, a propyl alcohol solution in which polyvinylphenol has been dissolved is applied to the semiconductor film. Thus a semiconductor layer and an insulating layer are formed.

U.S. Patent Application 20030136964 A1 proposes a method of forming a film by a solution coating method using a polycyclic aromatic compound to which a polar group is added. The polycyclic aromatic compound is a low molecular semiconductor material that usually tends not to dissolve in an organic solvent. In this case, however, the polar group is added to the polycyclic aromatic compound, which allows it to readily dissolve in an organic solvent. The organic material contained in the film thus formed is heat-treated and thereby the polar group is removed. Thus it is converted back to the original polycyclic aromatic molecules.

JP2003-258260A proposes a method of forming a thin and dense insulating film by forming a gate electrode of tantalum, aluminum, titanium, niobium, etc. and then anodizing the electrode. An organic semiconductor layer is formed on the insulating film.

In a FET, electric charges (electrons and holes) flow in the vicinity of the interface between an insulating layer and a semiconductor layer. Accordingly, the characteristics of the FET improve as the impurity levels present at the interface decrease. The causes of the generation of the impurity levels include dangling bonds of atoms that are present at the interface, disorder of the crystal structure, the presence of contaminants that adhered to the interface during the process of producing the insulating layer and the semiconductor layer, for example.

In the methods described in JP2003-518754A (WO01/047043) and U.S. Patent Application 20030136964 A1, a solution including an organic insulator material is applied and then is dried to form an insulating layer and thereafter a solution including an organic semiconductor material is applied onto the insulating layer. In these methods, however, since it takes time to dry the solution, there is a possibility that contaminants may adhere to the insulating layer during the drying process.

Furthermore, in the method described in JP2003-258260A, since the gate insulating film is formed by anodizing the gate electrode, there is a possibility that contaminants may adhere to the gate insulating film during this process.

Moreover, in the above-mentioned conventional methods, it is necessary to form an insulating layer and a semiconductor layer individually and therefore a number of steps are required.

DISCLOSURE OF INVENTION

In such a situation, one of the objects of the present invention is to provide a coating liquid that allows a layered film of an organic insulating layer and an organic semiconductor layer to be produced easily. Another object of the present invention is to provide a field effect transistor including an organic insulating layer and an organic semiconductor layer, and a method of manufacturing the same.

A coating liquid of the present invention includes a solvent as well as first and second organic molecules that have been dissolved in the solvent. The first organic molecule is a semiconductor material or a precursor of a semiconductor material. The second organic molecule is an insulator material or a precursor of an insulator material. The first organic molecule and the second organic molecule are not compatible with each other.

A method of the present invention for manufacturing a field effect transistor including an organic semiconductor layer and an organic insulating layer that adjoins the organic semiconductor layer includes the steps of:

(i) applying a coating liquid including a solvent as well as first and second organic molecules that have been dissolved in the solvent; and (ii) forming a first layer and a second layer by removing the solvent contained in the coating liquid that has been applied, with the first layer containing the first organic molecule as its main component, and with the second layer adjoining the first layer and containing the second organic molecule as its main component. The first organic molecule is a semiconductor material or a precursor of a semiconductor material, while the second organic molecule is an insulator material or a precursor of an insulator material. The first organic molecule and the second organic molecule are not compatible with each other.

In this specification, the term "main component" denotes a component whose content is at least 80 wt %.

A field effect transistor manufactured by the above-mentioned manufacturing method forms one aspect of the field effect transistor of the present invention.

From another viewpoint, a field effect transistor of the present invention includes an organic semiconductor layer and an organic insulating layer that adjoins the organic semiconductor layer. The organic semiconductor layer is a layer that contains, as its main component, a first organic molecule that is a semiconductor material. The organic insulating layer is a layer that contains, as its main component, a second organic molecule that is an insulator material. The proportion of the first organic molecule decreases gradually from the interface between the organic semiconductor layer and the organic insulating layer toward the outer-side surface of the organic insulating layer. The proportion of the second organic molecule decreases gradually from the interface between the organic semiconductor layer and the organic insulating layer toward the outer-side surface of the organic semiconductor layer. The first organic molecule and the second organic molecule are not compatible with each other. In this context, the phrase "decrease gradually" denotes that it never increases but it is always decreasing.

According to the present invention, since the gate insulating layer and the semiconductor layer can be formed simultaneously, organic FETs can be manufactured in fewer steps at lower cost. Furthermore, the present invention can prevent, for example, contaminants from adhering to the interface between the gate insulating layer and the semiconductor layer. Accordingly, the present invention allows a transistor with excellent characteristics (for instance, high mobility) to be formed.

In a field effect transistor of the present invention, a semiconductor layer and a gate insulating layer are present in a continuous organic thin film. Accordingly, the field effect transistor includes lower impurity levels that trap carriers and therefore can have higher carrier mobility.

DESCRIPTION OF THE INVENTION

Figure 1A:
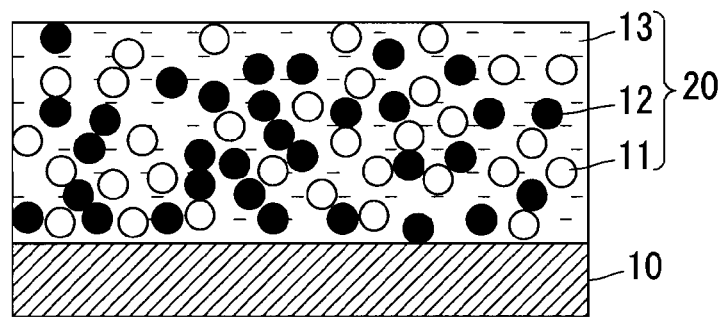
FIG. 1A is a cross-sectional view that schematically shows an example of one step of the method of forming a layered film using the coating liquid of the present invention.

Embodiments of the present invention are described below.

Coating Liquid

A coating liquid of the present invention contains a solvent as well as first and second organic molecules that have been dissolved in the solvent. The first organic molecules are a semiconductor material or a precursor of a semiconductor material. The second organic molecules are an insulator material or a precursor of an insulator material. The first organic molecules and the second organic molecules are not compatible with each other. With this coating liquid, a layered film of an organic semiconductor layer and an organic insulating layer can be formed.

The precursor of a semiconductor material or the precursor of an insulator material denotes one that becomes the semiconductor material or the insulator material through a treatment such as a heat treatment, baking, light irradiation, a chemical treatment, etc.

The phrase "not compatible" denotes that two kinds of organic molecules are not miscible but tend to be separated from each other. In other words, the phrase "not compatible" indicates that even when the first organic molecules and the second organic molecules are mixed together, the respective organic molecules are not mixed together at the molecular level and therefore are separated into an aggregate of the first organic molecules and an aggregate of the second organic molecules with the passage of time.

The compatibility can be defined thermodynamically. That is, it can be defined that when the following Formula (1) holds, the first organic molecules and the second organic molecules are not compatible with each other.

$$\Delta G = G - (n1 \times g1 + n2 \times g2) > 0 \tag{1}$$

In Formula (1), g1 and g2 are Gibbs free energy per mole of the first organic molecules and the second organic molecules, respectively. G denotes Gibbs free energy in the virtual state where n1 mole of first organic molecules and n2 mole of second organic molecules have been mixed together completely. Further, ΔG indicates the change in Gibbs free energy before and after mixing.

ΔG can be expressed by the following Formula (2) using mixing entropy ΔS and enthalpy change ΔH before and after the mixture.

$$\Delta G = \Delta H - T\Delta S = \Delta H + RT(n1 \times \ln(n1/N) + n2 \times \ln(n2/N)) \tag{2}$$

In Formula (2), R denotes a gas constant, T indicates an absolute temperature of a system, and N=n1+n2.

When the first organic molecules and the second organic molecules are high molecules and their molecular weights are large to some extent, the second member of the right-hand side in Formula (2) described above is small. Accordingly, the compatibility can be checked with the value of ΔH.

In this case, ΔH is equal to the quantity of heat that is generated when the first organic molecules and the second organic molecules are mixed together under constant pressure. In the case where heat is generated when they are mixed together, ΔH is minus. On the other hand, in the case where heat is absorbed when they are mixed together, ΔH is plus. Hence, when two kinds of organic molecules are both liquid, ΔH that is obtained when they are mixed together can be determined easily. Furthermore, in the case where the organic molecules are high molecules and are solid at ordinary temperatures and pressures but monomers thereof are liquid, the value of ΔH can be approximated by the quantity of heat that is generated when monomers of the respective organic molecules are mixed together. Accordingly, when monomers of the first and second organic molecules are liquids, the compatibility between the first and second organic molecules often can be judged by comparison in compatibility of the monomers thereof.

When both the monomers of the first organic molecules and the monomers of the second organic molecules are liquids, it also is possible to judge simply whether they are compatible with each other or not, without using Formula (2). First, monomers of the first organic molecules and monomers of the second organic molecules, weights of which have been measured beforehand, are put into a separating funnel and then are stirred for a fixed period of time to be mixed together Thereafter, it is allowed to stand still for a fixed period of time. After that, when the mixed liquid is separated into two layers, i.e. upper and lower layers, there is a possibility that the two kinds of monomers are not compatible with each other.

In order to judge strictly whether they are not compatible with each other, two separated liquids each are put into an individual container carefully and then the weight of each liquid is measured. Subsequently, with respect to the monomers of the first organic molecules and the monomers of the second organic molecules, the initial weight of the monomers with a lower density and the weight of the liquid of the upper layer are compared to each other, while the initial weight of the monomers with a higher density and the weight of the liquid of the lower layer also are compared to each other. When these weights are approximately equal to each other, it can be said that the monomers of the first organic molecules and the monomers of the second organic molecules are not compatible with each other. On the other hand, when the weights are different from each other, it can be said that they are compatible with each other.

The present inventors found out that a layered film in which the first organic molecules and the second organic molecules are separated into different layers from each other was able to be formed simultaneously by applying the above-mentioned coating liquid to a substrate and then removing the solvent. When using this coating liquid, a gate insulating layer and a semiconductor layer of an organic FET can be formed simultaneously through one-time solution application. Accordingly, the use of this coating liquid can prevent contaminants from adhering to the interface between the gate insulating layer and the semiconductor layer. In addition, there is a possibility that the mutual dissolution that may be a problem in conventional solution coating methods can be prevented from occurring, through the selection of suitable organic molecules.

There are many unclear points about what kind of the characteristics of the first organic molecules and the second organic molecules is required in order to allow them to be not compatible with each other, i.e. in order to allow them to be separated into two layers. It therefore is desirable actually to check each combination by experiment. It, however, has been proved that phase separation tends to occur in the following case.

That is, phase separation tends to occur between polar organic molecules and nonpolar organic molecules. In order for an organic molecule to have polarity, it needs to have a polar group such as a hydroxyl group, a sulfinyl group, an amino group, a carboxyl group, etc. On the other hand, in order for an organic molecule to be nonpolar, it needs to have a nonpolar group. Examples of the nonpolar group include a hydrocarbon group (($CH_2$)$_n$, where n is a natural number, for example, a natural number of 3 to 20) and a fluorocarbon group (($CF_2$)$_n$, where n is a natural number, for example, a natural number of 3 to 10).

Hence, one of the first organic molecules and the second organic molecules may include at least one group selected from a hydrocarbon group and a fluorocarbon group, while the other may include at least one polar group. For instance, the hydrocarbon group can be an alkyl group with a carbon number of approximately 3 to 20, while the fluorocarbon group can be a perfluoroalkyl group with a carbon number of approximately 3 to 10. In this case, it is preferable that the one of the first organic molecules and the second organic molecules include no polar group. The polar group of the other may be at least one group selected from a hydroxyl group, a carboxyl group, and an amino group.

In the present specification, the groups that are contained in the organic molecules may be side chains or parts of the main chains of the organic molecules.

Similarly, when a combination of organic molecules containing a fluorocarbon group and organic molecules containing a hydrocarbon group is employed, they are separated into two layers. It has been proved that both the fluorocarbon group and the hydrocarbon group are nonpolar but are not compatible with each other and therefore are separated into two layers (J. Vac. Sci. Technol. B, 1994, P2215-2218).

Hence, one of the first organic molecules and the second organic molecules may include a hydrocarbon group but no fluorocarbon group, while the other may include a fluorocarbon group. For instance, the hydrocarbon group can be an alkyl group with a carbon number of approximately 3 to 20, while the fluorocarbon group can be a perfluoroalkyl group with a carbon number of approximately 3 to 10.

The first organic molecules (a semiconductor material) containing a hydrocarbon group can be, for instance, a polythiophene derivative containing a hydrocarbon group, specifically poly(3-alkylthiophene) and poly(9,9-dialkylfluorene-co-bithiophene). On the other hand, the first organic molecules (a semiconductor material) containing a fluorocarbon group can be, for example, a polythiophene derivative containing a fluorocarbon group, specifically poly(3-fluoroalkylthiophene).

Furthermore, a polycyclic aromatic compound to which a functional group of improving its solubility in a solution has been added may be used as the first organic molecules. It has been known that when a polycyclic aromatic compound and a sulfinyl acetamide group (R—CO—N=S=O:R, which is a functional group) are allowed to undergo the Diels-Alder reaction, they are bonded to each other by a C—N bond and a C—S bond (where C denotes carbon contained in the aromatic compound, while N and S each indicate an element contained in the sulfinyl acetamide group). Accordingly, when a hydrocarbon group or a fluorocarbon group is used as R of the sulfinyl acetamide group, first organic molecules with lower polarity can be obtained. The polycyclic aromatic compound to which a sulfinyl amide group has been added does not have semiconductor characteristics. However, when it is heat-treated at a temperature of at least 100° C. after the film formation, the sulfinyl acetamide group is separated therefrom by the reverse Diels-Alder reaction and thereby polycyclic aromatic molecules having semiconductor characteristics are formed.

On the other hand, the second organic molecules (an insulator material) containing a hydrocarbon group can be, for instance, hydrocarbon-based resin, specifically, polystyrene, polyethylene, polybutadiene, etc. Moreover, the second organic molecules (an insulator material) containing a fluorocarbon group can be, for instance, fluorocarbon-based resin, specifically, polytetrafluoroethylene, etc.

As described above, the first organic molecules may be a polythiophene derivative. In this case, the second organic molecules may be polystyrene.

Furthermore, as described above, the first organic molecules may be a pentacene derivative. In this case, the second organic molecules may be polystyrene.

A solvent that can dissolve both the first organic molecules and the second organic molecules is used for the solvent of the coating liquid. For example, a solvent that has both characteristics of these two kinds of organic molecules can be used as the solvent. When one of the first organic molecules and the second organic molecules is nonpolar molecules and the other is polar molecules, for example, chloroform, higher alcohol, acetone, tetrahydrofuran, etc. can be used as the solvent. When both the first organic molecules and the second organic molecules are nonpolar molecules, for example, chloroform, higher alcohol, diethyl ether, tetrahydrofuran, etc. can be used.

Examples of the preferable combination of first organic molecules/second organic molecules/a solvent include the above-mentioned polythiophene derivative/polystyrene/chloroform, the above-mentioned pentacene derivative/polystyrene/chloroform, a polythiophene derivative/polystyrene/tetrahydrofuran, and a pentacene derivative/polystyrene/tetrahydrofuran.

From another viewpoint, the coating liquid of the present invention includes a solvent as well as organic molecules A and B that have been dissolved in the solvent. The organic molecules A are a semiconductor material or a precursor of a semiconductor material. The organic molecules B are an insulator material or a precursor of an insulator material. This coating liquid is a fluid that is separated into a first layer containing the organic molecules A as its main component and a second layer containing the organic molecules B as its main component when the solvent is removed by, for instance, air drying. The content of the organic molecules A in the first layer is at least 50 wt % (preferably at least 60 wt %) in the vicinity of the interface between the first layer and the second layer and increases toward the outer-side surface of the first layer. The content of the organic molecules A in the vicinity of one of the surfaces of the first layer that is located on the side farther from the second layer is at least 90 wt % (preferably at least 95 wt %), for example. On the other hand, the content of the organic molecules B in the second layer is at least 50 wt % (preferably at least 60 wt %) in the vicinity of the interface between the first layer and the second layer and increases toward the outer-side surface of the second layer. The content of the organic molecules B in the vicinity of one of the surfaces of the second layer that is located on the side farther from the first layer is at least 90 wt % (preferably at least 95 wt %), for example. The organic molecules A to be used herein can be those described as examples of the first organic molecules. Similarly, the organic molecules B to be used herein can be those described as examples of the second organic molecules. In this paragraph, the phrase "vicinity of the interface" denotes a region extending up to 10 nm from the interface, while the phrase "vicinity of the surface" indicates a region extending up to 10 nm from the surface.

Method of Manufacturing Layered Film of Semiconductor Layer and Insulating Layer A method of manufacturing a layered film of an organic semiconductor layer and an organic insulating layer using a coating liquid of the present invention is shown schematically in FIG. 1.

First, as shown in FIG. 1A, a coating liquid 20 is applied (Step (i)). The coating liquid 20 includes a solvent 13 as well as first and second organic molecules 11 and 12 that have been dissolved in the solvent 13. FIG. 1 shows the case where the coating liquid 20 has been applied onto a substrate 10. In some cases, however, it may be applied onto a substrate with a gate electrode formed thereon, depending on the kind of FET. The method of applying the coating liquid 20 is not limited. It can be applied by a method such as a spin coating method, a dip method, an ink-jet method, a screen printing method, a brush coating method, a roll coater method, or a doctor blade method, for example.

The coating liquid 20 includes the first organic molecules 11, the second organic molecules 12, and the solvent 13. The first organic molecules 11, the second organic molecules 12, and the solvent 13 that are used herein can be those described above. The first organic molecules 11 and the second organic molecules 12 are not compatible with each other but both can be dissolved in the solvent 13. The first organic molecules 11 and the second organic molecules 12 are mixed together freely in the solvent 13.

Next, the solvent 13 contained in the coating liquid 20 that has been applied is removed and thereby a first layer 14 and a second layer 15 are formed (Step (ii)). The first layer 14 contains the first organic molecules 11 as its main component. The second layer 15 adjoins the first layer 14 and contains the second organic molecules 12 as its main component. The method of removing the solvent 13 is not limited. It can be removed by air drying, drying by heating, or drying under reduced pressure, for example.

Figure 1B:
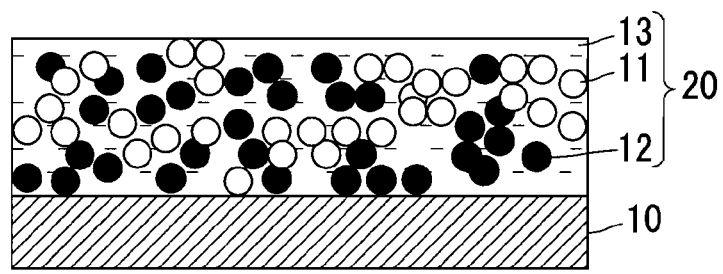
FIG. 1B is a cross-sectional view that schematically shows an example of the step following that shown in FIG. 1A.
Figure 1C:
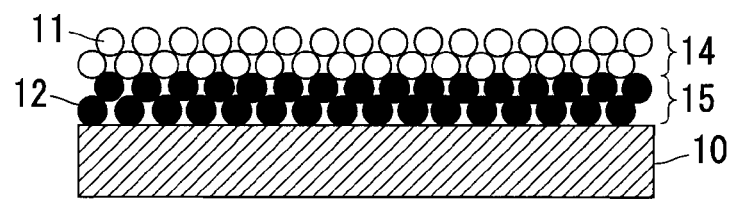
FIG. 1C is a cross-sectional view that schematically shows an example of the step following that shown in FIG. 1B.

FIG. 1B shows the state where a part of the solvent 13 has been volatilized with the passage of time. When the solvent 13 volatilizes, the concentrations of the first organic molecules 11 and the second organic molecules 12 increase. The distance between the first organic molecules 11 and the second organic molecules 12 is reduced accordingly. In this stage, when the first organic molecules 11 and the second organic molecules 12 are not mixed together freely but gather separately from each other, the solution as a whole has lower free energy. Hence, as shown in FIG. 1B, organic molecules of the same kind gather together in some parts of the coating liquid 20. Further, when time passes and thereby most of the solvent 13 has volatilized and disappeared, the first organic molecules 11 and the second organic molecules 12 form the first layer 14 and the second layer 15, respectively, as shown in FIG. 1C.

As described above, the use of the coating liquid of the present invention allows an insulating layer and a semiconductor layer to be formed simultaneously. Hence, as compared to the case of forming the respective layers individually by the conventional method, when using the coating liquid of the present invention, the number of steps can be reduced and contaminants can be prevented from adhering to the interface between the insulating layer and the semiconductor layer.

The first organic molecules may be a semiconductor material or a precursor of a semiconductor material. When the first organic molecules are a precursor of a semiconductor material, a first layer containing the precursor of the semiconductor material as its main component is formed on the substrate. Thereafter, the precursor (the first organic molecules) contained in the layer is treated, which allows an organic semiconductor layer to be formed from the first layer. For example, the first organic molecules are subjected to at least one treatment selected from a heat treatment, baking, light irradiation, and a chemical treatment, and thereby the semiconductor layer is formed.

Similarly, the second organic molecules may be a precursor of an insulator material. Similarly in this case, a second layer containing the second organic molecules as its main component is formed. Thereafter, the second organic molecules contained in the layer are treated, which allows an organic insulating layer to be formed from the second layer. For example, the second organic molecules are subjected to at least one treatment selected from a heat treatment, baking, light irradiation, and a chemical treatment, and thereby the insulating layer is formed.

FIG. 1 shows, as an example, the case where the second organic molecules 12 are deposited in the vicinity of the substrate 10, while the first organic molecules 11 are deposited far from the substrate 10. However, the first organic molecules 11 may be deposited in the vicinity of the substrate 10, while the second organic molecules 12 are deposited thereon, depending on the conditions. Which of the two kinds of organic molecules is disposed on the substrate side depends on the first and second organic molecules, the substrate, and the atmosphere to which the substrate is exposed. There is no general rule for deriving how the two kinds of organic molecules are separated from each other. However, it can be predicted to a certain degree, according to the respective polarities of the organic molecules and the substrate as well as the working environment in which the coating liquid is applied. In other words, those having polarity tend to gather together, while those having no polarity also tend to gather together. When the atmosphere to which the substrate is exposed is an ordinary air atmosphere, the atmosphere is considered to be nonpolar.

Suppose the first organic molecules are nonpolar molecules, the second organic molecules are polar molecules, the substrate surface has polarity, and the coating liquid of the present invention is applied in an air atmosphere. Then the formation of the layers is studied. Since both the second organic molecules and the substrate have polarity, the second organic molecules tend to be disposed in the vicinity of the substrate. On the other hand, since both the first organic molecules and the air atmosphere are nonpolar, the first organic molecules tend to be disposed so as to be in contact with air. Accordingly, under the supposed conditions described above, the second organic molecules tend to be disposed in the vicinity of the substrate, while the first organic molecules tend to be disposed far from the substrate.

Field Effect Transistor

A FET of the present invention includes an organic semiconductor layer and an organic insulating layer that adjoins the organic semiconductor layer. At least a part of the organic semiconductor layer functions as a channel region. A source electrode and a drain electrode are disposed so as to be in contact with the organic semiconductor layer.

The organic semiconductor layer and the organic insulating layer are those formed with the above-mentioned coating liquid. Hence, the organic semiconductor layer is a layer containing, as its main component (preferably at least 95 wt %), the first organic molecules that are an organic semiconductor material. On the other hand, the organic insulating layer is a layer containing, as its main component (preferably at least 95 wt %), the second organic molecules that are an insulator material. The proportion of the first organic molecules decreases gradually from the interface between the organic semiconductor layer and the organic insulating layer toward the outer-side surface of the organic insulating layer. On the contrary, the proportion of the second organic molecules decreases gradually from the interface between the organic semiconductor layer and the organic insulating layer toward the outer-side surface of the organic semiconductor layer.

Preferably, the content of the first organic molecules in the organic semiconductor layer is at least 50 wt % (preferably at lest 60 wt %) in the vicinity of the interface between the organic semiconductor layer and the organic insulating layer and is at least 95 wt % in the vicinity of the outer-side surface of the organic semiconductor layer. On the other hand, preferably, the content of the second organic molecules in the organic insulating layer is at least 50 wt % (preferably at least 60 wt %) in the vicinity of the interface between the organic semiconductor layer and the organic insulating layer and is at least 95 wt % in the vicinity of the outer-side surface of the organic insulating layer. In this paragraph, the phrase "vicinity of the interface" denotes a region extending up to 10 nm from the interface, while the phrase "vicinity of the surface" means a region extending up to 10 nm from the surface.

The organic semiconductor layer exhibits its properties even when containing a small amount of organic insulator material. Similarly, the organic insulating layer exhibits its properties even when containing a small amount of organic semiconductor material.

In the FET of the present invention, the change in concentration of the constituent molecules in the direction from the interface between the semiconductor layer and the insulating layer toward the semiconductor layer is gradual as compared to the case where the semiconductor layer and the insulating layer are produced individually through respective solution applications. Generally, the carrier trapping level density in the region where the element concentration changes gradually is lower than that in the region where the concentration changes sharply. Hence, the trapping level density at the interface between the semiconductor layer and the insulating layer of the FET according to the present invention is lower as compared to the case where the semiconductor layer and the insulating layer are produced individually through respective solution applications. In addition, the carrier mobility of the FET improves.

In the FET of the present invention, when the organic semiconductor layer and the organic insulating layer are those described above, the components other than those are not limited. For instance, the FET of the present invention may be a bottom gate type FET or a top gate type FET. When the organic semiconductor layer is disposed on the substrate side with respect to the organic insulating layer, a top gate type FET can be formed. On the other hand, when the organic insulating layer is disposed on the substrate side with respect to the organic semiconductor layer, a bottom gate type FET can be formed.

Figure 2A:
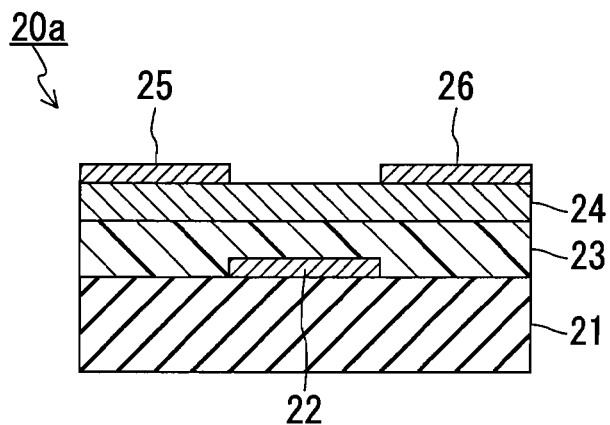
FIG. 2A is a cross-sectional view showing the configuration of an example of the field effect transistor.
Figure 2B:
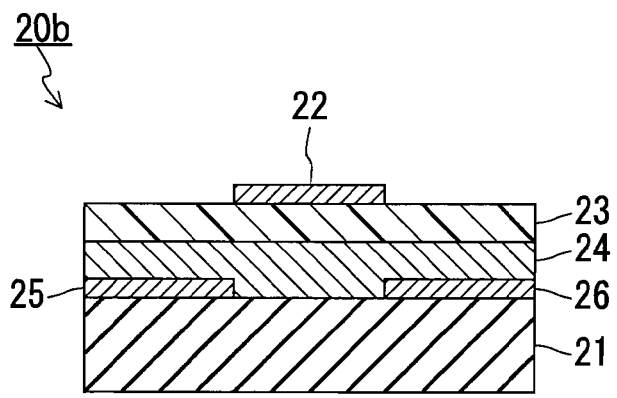
FIG. 2B is a cross-sectional view showing the configuration of another example of the field effect transistor.

FIG. 2A shows an example of the bottom gate type FET, while FIG. 2B shows an example of the top gate type FET. A FET 20a shown in FIG. 2A and a FET 20b shown in FIG. 2B each include a substrate 21, a gate electrode 22, an organic insulating layer 23, an organic semiconductor layer 24, a source electrode 25, and a drain electrode 26.

In the FET 20a, the gate electrode 22 is formed on the substrate 21. The organic insulating layer 23 is formed so as to cover the gate electrode 22. The organic semiconductor layer 24 is stacked on the organic insulating layer 23. The source electrode 25 and the drain electrode 26 are formed on the organic semiconductor layer 24.

On the other hand, in the FET 20b, the source electrode 25 and the drain electrode 26 are formed on the substrate 21. The organic semiconductor layer 24 is formed to cover the source electrode 25 and the drain electrode 26. The organic insulating layer 23 is stacked on the organic semiconductor layer 24. The gate electrode 22 is formed on the organic insulating layer 23.

The organic insulating layer 23 and the organic semiconductor layer 24 are formed using the coating liquid of the present invention. For the parts other than them, members that are used in well-known organic FETs can be used, for example.

Method of Manufacturing Field Effect Transistor

A method of the present invention for manufacturing a field effect transistor includes the above-mentioned method for manufacturing a layered film of an organic semiconductor layer and an organic insulating layer (i.e. the above-mentioned manufacturing method including Steps (i) and (ii)). An organic FET manufactured by this manufacturing method is one of the FETs according to the present invention.

EXAMPLES

Hereafter, examples of the present invention are described but the present invention is not limited to the following examples.

Example 1

In Example 1, the description is directed to an example in which a polythiophene derivative (poly(3-perfluorooctylthiophene)) is used as the first organic molecules, while polystyrene is used as the second organic molecules.

(1) Method of Synthesizing Poly(3-Perfluorooctylthiophene)

Figure 3:
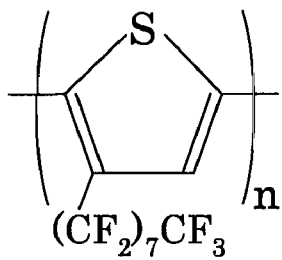
FIG. 3 is a diagram showing the structure of poly(3-perfluorooctylthiophene).

The poly(3-perfluorooctylthiophene) shown in FIG. 3 was produced as follows. That is, 3-perfluorooctylthiophene was synthesized, and this was used as a starting material with which 2,5-dibromo-3-perfluorooctylthiophene was synthesized and then was polymerized. The methods of synthesizing 3-perfluorooctylthiophene, 2,5-dibromo-3-perfluorooctylthiophene, and poly(3-perfluorooctylthiophene) are described below sequentially.

(1-a) Method of Synthesizing 3-Perfluorooctylthiophene

In a mixed solution of copper powder 10 g, 3-iodothiophene 10.5 g, 3-perfluoro-n-octyliodide 32.8 g, and N,N-dimethylformamide 60 ml, a reaction was allowed to proceed in a dry nitrogen atmosphere at 120° C. for 20 hours. After the reaction solution thus obtained was filtered, the filtrate was washed with 18-vol % hydrochloric acid and a 20-vol % sodium thiosulfate aqueous solution in this order. Subsequently, magnesium sulfate powder was added to the filtrate and thereby the filtrate was dried. Thereafter, 3-perfluorooctylthiophene was extracted by a distillation method from the product thus obtained.

(1-b) Method of Synthesizing 2,5-Dibromo-3-Perfluorothiophene

Next, 3-perfluorooctylthiophene (70 mmol) was dissolved in tetrahydrofuran (100 ml) and then N-bromosuccinimide (154 mmol) was added thereto. This then was stirred at room temperature for two hours. Thereafter, the solvent was removed with an evaporator. Subsequently, hexane (250 ml) was added thereto to allow N-bromosuccinimide to precipitate. This then was filtered. The solvent is removed from the filtrate thus obtained, using the evaporator. The remaining solution was refined through distillation under the conditions of 120° C. and 2.7 Pa (0.02 Torr). As a result, 2,5-dibromo-3-perfluorothiophene was obtained.

(1-c) Method of Synthesizing Poly(3-Perfluorooctylthiophene)

First, 2,5-dibromo-3-perfluorothiophene 3.12 mmol was dissolved in tetrahydrofuran 18 ml. A butyl ether solution of methylmagnesiumbromide (whose concentration was 1.0 M) was added thereto, which then was allowed to react under a reflux condition for one hour. Subsequently, [1,3-bis(diphenylphosphino)propane]nickel (II) chloride 16.9 mg was added to the solution, which then was allowed to react under a reflux condition for two hours. The reaction solution was dissolved in methanol 150 ml, which then was filtered. Solids that were not filtered and thus remained were placed in a Soxhlet extractor. Monomers and salts then were extracted with methanol. Subsequently, a catalyst and oligomers were extracted with hexane. Finally, poly(3-perfluorooctylthiophene) was extracted with chloroform. The solvent was removed from the chloroform solution thus extracted, using the evaporator. Thus solid poly(3-perfluorooctylthiophene) was obtained.

(2) Preparation of Coating Liquid

The coating liquid was produced using poly(3-perfluorooctylthiophene) as the first organic molecules that are a semiconductor material and polystyrene as the second organic molecules that are an insulator material.

Before producing the coating liquid, the compatibility of these materials was checked as follows. First, 2.00 g of 3-perfluorooctylthiophene which is a monomer of poly(3-perfluorooctylthiophene), and 4.00 g of styrene that is a monomer of polystyrene were put into a separating funnel. This was stirred for one hour and then was allowed to stand for one hour. After that, the solution contained in the separating funnel was separated into two layers. The specific gravity of 3-perfluorooctylthiophene is greater than that of styrene. Accordingly, it can be surmised that the lower layer of the separated liquid is 3-perfluorooctylthiophene, while the upper layer is styrene. After these two liquids were separated from each other carefully, each of them was weighed. The weight of the liquid of the upper layer was 4.00 g, while that of the liquid of the lower layer was 2.00 g. The weights of the liquid of the upper layer and the liquid of the lower layer are equal to those that styrene and 3-perfluorooctylthiophene had before being mixed, respectively. Hence, it can be surmised that these two liquids are not compatible with each other. Accordingly, it also can be surmised that the poly(3-perfluorooctylthiophene) and polystyrene that are polymers of those liquids are not compatible with each other.

Next, polystyrene, poly(3-perfluorooctylthiophene), and tetrahydrofuran were mixed together so that 3 wt % of polystyrene and 3 wt % poly(3-perfluorooctylthiophene) were contained therein. This then was stirred for one hour. Thus a coating liquid (C1) of Example 1 was produced. The coating liquid (C1) was a transparent homogeneous liquid. From this, it was confirmed that both polystyrene and poly(3-perfluorooctylthiophene) dissolved in tetrahydrofuran.

(3) Production of Organic FET

A chromium film with a thickness of 1 nm was formed on one surface of a quartz glass substrate with a size of 50 mm×50 mm and a thickness of 0.5 mm. A gold film with a thickness of 100 nm then was formed thereon. These films were formed by a vacuum sputtering method.

Next, the above-mentioned coating liquid (C1) was applied to the substrate by a spin coating method. The spin coating was carried out as follows. That is, after the coating liquid (C1) was dropped on the substrate, the substrate was rotated at 500 rpm for five seconds and further was rotated at 4000 rpm for 30 seconds. Subsequently, the substrate with the coating liquid (C1) applied thereto was dried at a room temperature of 25° C. for one hour. Thereafter, a source electrode and a drain electrode that were formed of gold were produced by a vacuum electron-beam vapor deposition method using a shadow mask. The gate length was 100 μm, while the gate width was 3 mm.

As a comparative example, a polystyrene layer that was a gate insulating layer and a poly(3-perfluorooctylthiophene) layer that was a semiconductor layer were formed individually by the coating method. Thus an organic FET was produced. First, a chromium film and a gold film were formed on a quartz substrate. Subsequently, a chloroform solution in which 3 wt % of polystyrene alone had been dissolved was applied thereto by spin coating. This then was dried at a room temperature of 25° C. for one hour. Next, a perfluorooctane solution in which 3 wt % of poly(3-perfluorooctylthiophene) alone had been dissolved was applied thereto by spin coating. This then was dried at a room temperature of 25° C. for one hour. Since polystyrene does not dissolve in perfluorooctane, the phenomenon of mutual dissolution, i.e. that the polystyrene film dissolves into the solution during the application of the semiconductor material, did not occur. The conditions for the spin coating were the same as those for the spin coating by which the coating liquid (C1) was applied. Thereafter, a source electrode and a drain electrode were formed using the electron-beam vapor deposition method. Thus, a FET of the comparative example was produced.

(4) Evaluations of Spin-Coated Film and Organic FET (4-a) Analysis of Composition of Spin-Coated Film With respect to the films formed by the spin coating, the concentration distributions in the depth direction of a fluorine element, a carbon element, and a gold element that were contained in the film were determined by a secondary ion mass spectrometry method (SIMS) before the source electrode and the drain electrode were formed. The concentration distributions in the depth direction were determined by repeating operations in which the element concentrations of the film surface were measured, then a certain amount of the surface of the film was removed by argon sputtering and thereafter the element concentration was measured again.

The depth at the time of measurement was determined from the sputtering rate (the thickness of the film to be removed within a unit time) of the argon sputtering. The sputtering rate was calculated by the following method. First, the thickness of the film containing polystyrene alone formed by the spin coating method was measured with a film thickness gauge beforehand. Next, the period of time was measured that was required to remove the film completely under the same sputtering conditions as those employed for the SIMS measurement. The thickness of the film that was removed by the argon sputtering within a unit time was calculated from the film thickness and the period of time required for sputtering. Similarly, with respect to the film containing poly(3-perfluorooctylthiophene) alone, the sputtering rate was calculated by the same method.

Figure 4:
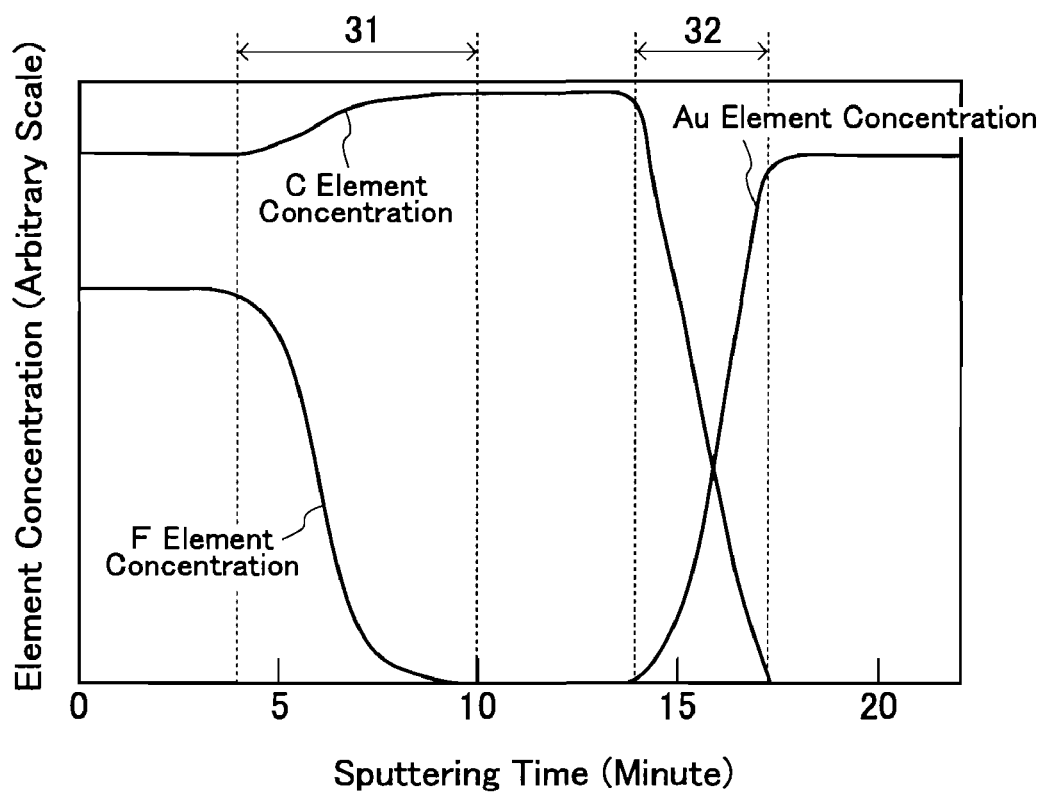
FIG. 4 is a graph showing an example of the SIMS measurement carried out with respect to a film produced using the coating liquid of the present invention.

FIG. 4 shows a graph indicating the results of the SIMS measurement with respect to the layered film produced with the coating liquid (C1). The horizontal axis of the graph indicates the period of time for which the argon sputtering was carried out, while the vertical axis indicates the concentrations of fluorine, carbon, and gold elements. The element concentrations indicated by the vertical axis were normalized with the maximum values of the respective elements. The amount of the film that is removed by sputtering is proportional to the sputtering time. Accordingly, the sputtering time indicated by the horizontal axis corresponds to the depth that is measured from the outermost surface of the film toward the inner side of the film. Hence, for convenience sake, the surface of the film exposed by sputtering carried out for t minutes is referred to as a "depth of t minute" in the following description. As is clear from FIG. 4, the respective element concentrations increased or decreased rapidly with the passage of sputtering time in a range of 31 (4 to 10 minutes) and a range 32 (14 to 17 minutes) shown in FIG. 4 but were otherwise constant. The fluorine element concentration decreased to zero in the range 31. The carbon element concentrate increased in the range 31 but decreased to zero in the range 32. Furthermore, the gold element concentration increased from zero to be constant in the range 32. The periods of sputtering time that were required for the concentrations of the fluorine, carbon, and gold elements to become half the maximum values thereof (hereinafter also referred to as "half-reduced time") were 6 minutes, 16 minutes, and 16 minutes, respectively.

The fluorine element is derived from a component of poly (3-perfluorooctylthiophene), while the carbon element is derived from components of both poly(3-perfluorooctylthiophene) and polystyrene. In addition, gold is derived from gold electrodes formed on the quartz glass substrate. In consideration of these, the composition of the film was surmised as follows.

After the argon sputtering for a minimum of 14 minutes, the gold element was detected and the concentration of the carbon element decreased accordingly. It therefore can be surmised that the film was removed by the argon sputtering and thereby the gold electrodes formed on the substrate appeared at the surface. The concentrations of the gold element and the carbon element did not change stepwise rapidly with the change in sputtering time. The reason for this can be surmised as follows. That is, signals from elements that are present at the film surface and those from elements that are present on the inner side of the surface are detected simultaneously in the SIMS analysis and in addition, the film surface comes to have a shape including concavities and convexities through the sputtering. Accordingly, even if the film exists at the substrate surface, gold that is present under the film appears at the surface in the concavity parts of the film. Hence, it is surmised that in this measurement, the film was removed completely by sputtering after 16 minutes, which is the half-reduced time of gold.

Thus the film formed in the example exists between the depths of 0 to 16 minutes shown in FIG. 4. From the change in the fluorine element concentration, it can be surmised that most of the poly(3-perfluorooctylthiophene) is present up to the depth of 6 minutes that is the half-reduced time and it is not present after that. On the other hand, it is conceivable that the concentration of the carbon element increases from 6 minutes, which is the half-reduced time. If the polystyrene is present up to the depth of 6 minutes like poly(3-perfluorooctylthiophene), the carbon element concentration ought to decrease from the depth of 6 minutes but, on the contrary, it increased as shown in FIG. 4. From this, it can be surmised that polystyrene hardly is present up to the depth of 6 minutes. Thus, it can be surmised that most of the components that are present up to the depth of 6 minutes from the outermost surface of the film is poly(3-perfluorooctylthiophene), while most of the film that is present between the depths of 6 and 16 minutes is formed of polystyrene.

From the sputtering rates with respect to poly(3-perfluorooctylthiophene) and polystyrene as well as the analysis described above, it was surmised that the thickness of the whole spin-coated film was 170 nm, and a layer of poly(3-perfluorooctylthiophene) was present in the region extending from the film surface to a depth of around 50 nm, while a layer of polystyrene was present in the region extending from a depth of around 50 nm to a depth of around 170 nm.

It was confirmed from the results of the SIMS analysis described above that the use of the coating liquid of the present invention made it possible simultaneously to form the poly(3-perfluorooctylthiophene) layer that is a semiconductor layer and the polystyrene layer that is an insulating layer. Furthermore, from another viewpoint, the film formed of those two layers is an organic thin film in which the concentration of the insulator material is high in the vicinity of the gate electrode, while the concentration of the semiconductor material is high in the region far from the gate electrode.

(4-b) Evaluation of Transistor Characteristics

The transistor characteristics were determined using a Semiconductor Parameter Analyzer 4155B (manufactured by Agilent Technology). Specifically, a voltage of 80 V was applied between the source electrode and the drain electrode and the gate voltage was changed in the range of −50 to 50 V. In the region where the source-drain current value and the value of the square of gate voltage are proportional to each other, carrier mobility was derived using the following Formula:

$$I_d = \mu \times W \times \epsilon_0 \times \epsilon \times V_g^2 / (2 \times L \times t),$$

where $I_d$ denotes source-drain current; $V_g$ indicates gate voltage; $\mu$ denotes mobility; L indicates the length of the source-drain channel, which is 100 (μm); W denotes the width of the source-drain channel, which is 3 (mm); $\epsilon$ denotes the relative dielectric constant of the insulting layer, which is 2.5; $\epsilon_0$ denotes the dielectric constant of vacuum; and t indicates the thickness of the insulating layer.

The mobility of the organic FET produced in the example was 0.02 cm²/Vs, while the ratio of ON current versus OFF current between the source and drain electrodes was $10^5$.

Next, an evaluation was made with respect to the organic FET of the comparative example that was produced by individually forming the polystyrene film that was the gate insulating layer and the poly(3-perfluorooctylthiophene) film that was the semiconductor layer by the coating method. The results are described below.

Figure 5:
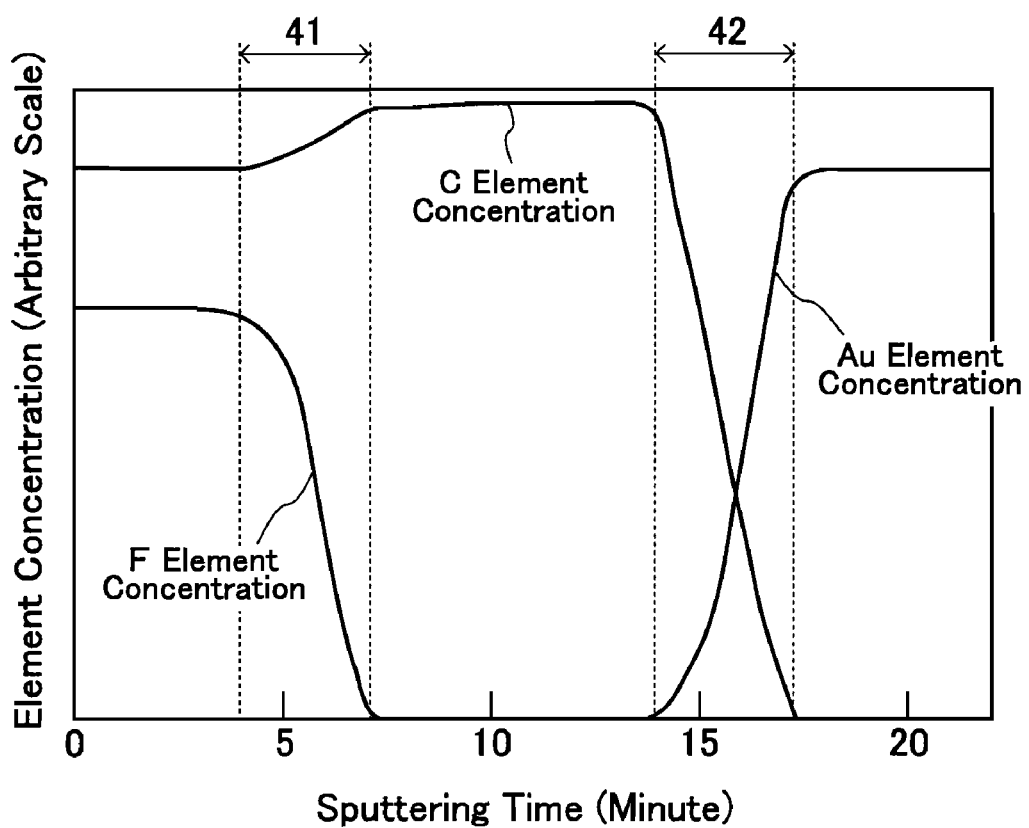
FIG. 5 is a graph showing an example of the SIMS measurement carried out with respect to a film produced by a conventional method.

Like FIG. 4, FIG. 5 is a graph showing the results of SIMS measurements with respect to the spin-coated film obtained before the source and drain electrodes were formed. FIG. 5 shows the correlation between the sputtering time and the concentrations of specified elements. The shape of the graph shown in FIG. 5 is approximately the same as that of the graph show in FIG. 4. The graph shown in FIG. 5 was different from that shown in FIG. 4 only in the region of a range 41 (a sputtering time between 4 to 7 minutes) where the fluorine element concentration and the carbon element concentration change rapidly.

The range 41 shown in FIG. 5 was shorter than the range 31 (4 to 10 minutes) shown in FIG. 4. This indicates that the rates of change of the fluorine element concentration and the carbon element concentration in the thickness direction in the film shown in FIG. 5 are higher than those of the film shown in FIG. 4. Further, this indicates that the film of the comparative example that was produced by forming the gate insulating layer and the semiconductor layer individually through respective solution applications has a clear boundary between the insulating layer and the semiconductor layer as compared to the film of the example. Moreover, the mobility of the organic FET of the comparative example was 0.005 cm²/Vs, which was lower as compared to the case where the insulating layer and the semiconductor layer were formed simultaneously. Conceivably, one of the reasons is that the interface between the insulating layer and the semiconductor layer of the FET produced in the comparative example is contaminated considerably as compared to the case where the insulating layer and the semiconductor layer are produced simultaneously using the coating liquid (C1) of the present invention. In addition, conceivably, another reason is that since the composition elements vary irregularly at the interface of the comparative example, the trapping level density becomes high. Thus, it can be surmised that the interface level density of the FET of the comparative example was higher than that of the FET formed using the coating liquid (C1) of the present invention and as a result, carriers of the FET of the comparative example had lower mobility.

As described above, the use of the coating liquid of the present invention made it possible to produce the gate insulating layer and the semiconductor layer simultaneously.

Example 2

In Example 2, the description is directed to an example in which a pentacene derivative (sulfinylperfluorooctaneamide-added pentacene) was used as the first organic molecules, while polystyrene was used as the second organic molecules. The sulfinylperfluorooctaneamide-added pentacene is a precursor of a semiconductor material.

(1) Method of Synthesizing Sulfinylperfluorooctaneamide-Added Pentacene

The sulfinylperfluorooctaneamide-added pentacene was synthesized by allowing pentacene and sulfinylperfluorooctaneamide to react each other. Sulfinylperfluorooctaneamide was synthesized from perfluorooctaneamide. The methods of synthesizing sulfinylperfluorooctaneamide and sulfinylperfluorooctaneamide-added pentacene are described below sequentially.

(1-a) Method of Synthesizing Sulfinylperfluorooctaneamide

First, perfluorooctaneamide ($CF_3(CF_2)_7CONH_2$) (46 g) was dissolved in n-hexane (300 ml). Thereafter, trimethylchlorosilane (15 ml) was dropped gradually into the solution obtained above, in a dry nitrogen atmosphere. Then this was allowed to react for two hours while being stirred. After the reaction was completed, hexadecane contained in the reaction solution was removed with the evaporator. Thus, N,N-bis(trimethylsilyl)perfluorooctaneamide was obtained.

Next, thionyl chloride ($SOCl_2$) 2.4 g was added gradually to N,N-bis(trimethylsilyl)perfluorooctaneamide 12 g in the dry nitrogen atmosphere, which was allowed to react for two hours while being stirred. Then this was distilled and thereby sulfinylperfluorooctaneamide was obtained.

(1-b) Method of Synthesizing Sulfinylperfluorooctaneamide-Added Pentacene

A mixed solution of sulfinylperfluorooctaneamide (3 g), pentacene (0.5 g), chloroform (30 ml), and methyltrioxorhenium (0.005 g) was allowed to react for 48 hours under the reflux condition while being stirred. The reaction product was separated by flash chromatography. Thus sulfinylperfluorooctaneamide-added pentacene was obtained.

(2) Preparation of Coating Liquid

Both sulfinylperfluorooctaneamide-added pentacene and polystyrene are solid. It, however, is possible to surmise the compatibility between the molecules of them by the following method.

That is, the polarity of the molecules of sulfinylperfluorooctaneamide-added pentacene should have polarities of the molecules of both sulfinylperfluorooctaneamide and pentacene. In addition, the polarity of the molecules of polystyrene can be approximated by the polarity of styrene. On the other hand, since pentacene does not dissolve in most of the organic solvents, it can be surmised that it also does not dissolve in styrene. Hence, when sulfinylperfluorooctaneamide is not compatible with styrene, it can be considered that sulfinylperfluorooctaneamide-added pentacene also is not compatible with both styrene and polystyrene. Thus, the compatibility between the sulfinylperfluorooctaneamide and styrene was evaluated by the same method as in Example 1. As a result, it was proved that these two compounds were not compatible with each other. Accordingly, it was considered that sulfinylperfluorooctaneamide added pentacene and polystyrene were not compatible with each other.

Next, sulfinylperfluorooctaneamide-added pentacene, polystyrene, and chloroform were put into a container so that the content of sulfinylperfluorooctaneamide-added pentacene was 3 wt %, while the content of polystyrene also was 3 wt %. This was mixed together for one hour. Thus, a coating liquid (C2) of Example 2 was prepared. The coating liquid (C2) was a transparent solution and contained the above-mentioned two kinds of organic molecules that had been dissolved in chloroform uniformly.

(3) Production of Organic FET

An organic FET was produced by the same method as in Example 1 except that the coating liquid (C2) was used instead of the coating liquid (C1). Using the coating liquid (C2), a first layer that was composed mainly of sulfinylperfluorooctaneamide-added pentacene and a second layer that was composed mainly of polystyrene were formed.

Figure 6:
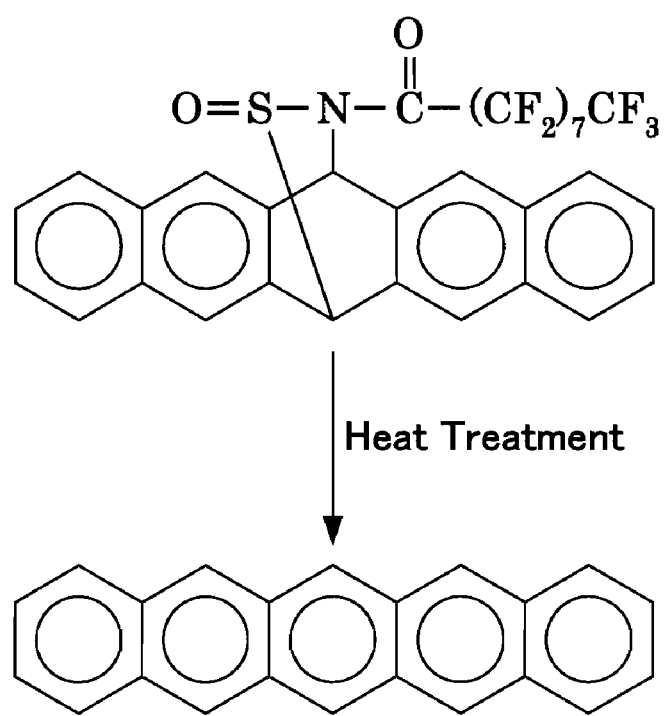
FIG. 6 is a diagram showing the manner in which sulfinylperfluorooctaneamide-added pentacene is converted to pentacene through a heat treatment.

After a source electrode and a drain electrode were formed, the organic FET was heat-treated in the dry nitrogen atmosphere at 180° C. for two minutes. With this heat treatment, as shown in FIG. 6, sulfinylperfluorooctaneamide was separated from sulfinylperfluorooctaneamide-added pentacene. Thus an organic semiconductor layer was formed that contained, as its main component, pentacene that was a semiconductor material.

(4) Results of Evaluations of Spin-Coated Film and Organic FET

With respect to the spin-coated film (the organic semiconductor layer/the organic insulating layer) obtained before the production of the source and drain electrodes, the change in element concentration in the depth direction was determined in the same manner as in Example 1. In addition, an evaluation was made with respect to the characteristics of the organic FET produced in this example.

The SIMS element analysis proved the following. The whole spin-coated film had a thickness of 100 nm. A layer of sulfinylperfluorooctaneamide-added pentacene existed from the film surface to the vicinity of a depth of 40 nm. On the other hand, a polystyrene film existed from the vicinity of a depth of 40 nm to the vicinity of a depth of 100 nm.

Furthermore, the organic FET produced in this example had a carrier mobility of 0.01 cm$^2$/Vs, while the ratio of ON current versus OFF current between the source and drain electrodes was $10^5$.

As described above, the use of the coating liquid of the present invention made it possible to produce the insulating layer and the semiconductor layer simultaneously.

Example 3

In Example 3, the description is directed to an example in which sulfinylperfluorooctaneamide-added pentacene that was described in Example 2 was used as the first organic molecules, while polyvinyl alcohol was used as the second organic molecules.

A coating liquid (C3) of Example 3 was prepared as follows. That is, sulfinylperfluorooctaneamide-added pentacene and polyvinyl alcohol were dissolved in a solvent so that the content of the former was 3 wt %, while the content of the latter also was 3 wt %. The solvent used herein was a mixed solvent of tetrahydrofuran and 2,2,2-trifluoroalcohol (whose volume ratio was 1:1). Thus an organic FET was produced by the same method as in Example 2 except that the coating liquid (C3) was used instead of the coating liquid (C2).

In addition, an organic FET of a comparative example was produced as follows. First, a chromium thin film and a gold thin film were formed on a quartz substrate. Next, a mixed solution of water and ethanol (whose volume ratio was 1:4) in which polyvinyl alcohol 3 wt % alone had been dissolved was applied by spin coating, which then was dried at room temperature (25° C.) for one hour. Thereafter, a chloroform solution in which sulfinylperfluorooctaneamide-added pentacene 3 wt % alone had been dissolved was applied by spin coating, which then was dried at room temperature (25° C.) for one hour. Thus, a polyvinyl alcohol film (a gate insulating layer) and a sulfinylperfluorooctaneamide-added pentacene film (a layer to become a semiconductor layer) were formed sequentially by the solution coating method. Thereafter, a source electrode and a drain electrode were formed using the electron-beam vapor deposition method.

The SIMS measurement was carried out with respect to the film formed using the coating liquid (C3). As a result, it was confirmed that the sulfinylperfluorooctaneamide-added pentacene layer had been formed on the polyvinyl alcohol layer in the film.

The SIMS measurement also was carried out with respect to the film that had been produced by sequentially forming the polyvinyl alcohol layer and the sulfinylperfluorooctaneamide-added pentacene layer by the spin coating method. As a result, it was also confirmed that the sulfinylperfluorooctaneamide-added pentacene layer was stacked on the polyvinyl alcohol layer in the film of the comparative example. With respect to the film of the comparative example, when the chloroform solution in which sulfinylperfluorooctaneamide-added pentacene had been dissolved was applied onto the polyvinyl alcohol layer, no mutual dissolution occurred. It can be surmised that this was because the polyvinyl alcohol was water soluble and therefore did not dissolve into the chloroform solution.

The organic FET produced using the coating liquid (C3) had a carrier mobility of 0.005 cm$^2$/Vs, while the ratio of ON current versus OFF current between the source and drain electrodes was $10^4$. On the other hand, the FET of the comparative example had a mobility of 0.001 cm$^2$/Vs, while the ratio of ON current versus OFF current was 10$^4$.

The carrier mobility of the organic FET of the present invention that was produced using the coating liquid (C3) was greater than that of the organic FET of the comparative example. It can be surmised that this is because the level density of the interface between the insulating layer and the semiconductor layer of the organic FET according to the present invention is lower than that of the organic FET according to the comparative example.

As described above, the use of the coating liquid of the present invention made it possible to control the level density of the interface between the insulating layer and the semiconductor layer to a lower value. As a result, an organic FET with greater carrier mobility was produced.

Example 4

In Example 4, the description is directed to an example in which sulfinylperfluorooctaneamide-added pentacene that was described in Example 2 was used as the first organic molecules, while polyvinyl acetate was used as the second organic molecules.

A coating liquid (C4) of Example 4 was prepared as follows. That is, sulfinylperfluorooctaneamide-added pentacene and polyvinyl acetate were dissolved in a solvent so that the content of the former was 3 wt %, while the content of the latter also was 3 wt %. The solvent used herein was a mixed solvent of tetrahydrofuran and 2,2,2-trifluoroalcohol (whose volume ratio was 1:1). Then an organic FET was produced by the same method as in Example 2 except that the coating liquid (C4) was used instead of the coating liquid (C2).

The SIMS measurement was carried out with respect to the film formed using the coating liquid (C4). As a result, it was confirmed that the sulfinylperfluorooctaneamide-added pentacene layer had been formed on the polyvinyl acetate layer. The organic FET produced using the coating liquid (C4) had a mobility of 0.005 cm$^2$/Vs, while the ratio of ON current versus OFF current between the source and drain electrodes was 10$^4$.

Example 5

In Example 5, the description is directed to an example in which a pentacene derivative (6,13-bis(perfluorooctyl)pentacene) was used as the first organic molecules, while polystyrene was used as the second organic molecules.

The 6,13-bis(perfluorooctyl)pentacene was synthesized by the following method. First, perfluorooctyliodide (CF$_3$(CF$_2$)$_7$I) (5 g) and a diethyl ether solution of phenylmagnesium bromide (C$_6$H$_5$MgBr) (3 ml) (with a concentration of 3 M) were added to diethyl ether (40 ml), which then was allowed to react in the nitrogen atmosphere at −50° C. for 30 minutes while being stirred. With this reaction, perfluorooctyl magnesium bromide (CF$_3$(CF$_2$)$_7$MgBr) was formed.

Next, while the reaction solution was kept at −50° C. in the nitrogen atmosphere, 6,13-pentacene-quinone (0.6 g) was added thereto. Thereafter, the temperature thereof was raised gradually to room temperature over a period of four hours. Subsequently, about 5 ml of 30-vol % hydrochloric acid aqueous solution obtained by dissolving hydrochloric acid in saturated tin chloride was dropped into the reaction solution, which then was heated at 60° C. for two hours. Thus, 6,13-bis(perfluorooctyl)pentacene was formed.

Next, the reaction solution was washed with pure water. This was then dehydrated with sodium sulfate and thereby was concentrated. The concentrate was dissolved in toluene. This then was refined by column chromatography. For the column chromatography, silica (Wakogel C-200; Wako Pure Chemical Industries, Ltd.) was used as a filler, while toluene was used as a developer. Subsequently, after the solvent was concentrated, 6,13-bis(perfluorooctyl)pentacene was recrystallized with toluene.

A coating liquid (C5) was prepared using the 6,13-bis(perfluorooctyl)pentacene thus obtained. Specifically, 6,13-bis(perfluorooctyl)pentacene and polystyrene were dissolved in tetrahydrofuran so that the content of the former was 3 wt %, while the content of the latter also was 3 wt %. Thus the coating liquid (C5) was prepared. Thereafter, a FET was produced by the same method as in Example 1 except that the coating liquid (C5) was used. The FET then was evaluated. As in Example 1, the element concentration change in the depth direction was measured with respect to the spin-coated film (the organic semiconductor layer/the organic insulating layer) obtained before source and drain electrodes were formed.

From the SIMS measurement, it was confirmed that the 6,13-bis(perfluorooctyl)pentacene layer had been formed on the polystyrene layer in the film formed using the coating liquid (C5). The organic FET produced in this example had a mobility of 0.1 cm$^2$/Vs, while the ratio of ON current versus OFF current between the source and drain electrodes was 10$^4$.

Example 6

In Example 6, the description is directed to an example in which a top gate type FET was produced. In Example 6, a polythiophene derivative (poly(3-octylthiophene)) was used as the first organic molecules, while CYTOP (Trade Name, a product of Asahi Glass Co., Ltd., Grade A) having a fluoroalkyl chain was used as the second organic molecules.

(1) Preparation of Coating Liquid

Poly(3-octylthiophene) and CYTOP were dissolved in tetrahydrofuran so that the content of the former was 1 wt %, while the content of the latter also was 1 wt %. Thus the coating liquid (C6) was prepared.

(2) Production of Organic FET

A chromium film with a thickness of 1 nm was formed on one surface of a quartz glass substrate with a size of 50 mm×50 mm and a thickness of 0.5 mm. A gold film with a thickness of 100 nm was formed thereon. These films were formed by the vacuum sputtering method.

Next, the above-mentioned metal films were patterned by the photolithography method and thereby a source electrode and a drain electrode were formed. The channel length was 100 μm, while the channel width was 3 mm. In those electrodes, the chromium film serves to allow the gold film and the substrate to tightly adhere to each other.

Next, the above-mentioned coating liquid (C6) was applied to the substrate by the spin coating method as in Example 1. Subsequently, the substrate to which the coating liquid (C6) had been applied was dried at room temperature for one hour. Thereafter, a gate electrode was formed in a position determined in consideration of the arrangement of the source and drain electrodes. The gate electrode was formed by depositing gold by the electron-beam vapor deposition method using a shadow mask. Thus, the top gate type organic FET was produced.

(3) Results of Evaluations of Spin-Coated Film and Organic FET

With respect to the spin-coated film (the organic semiconductor layer/the organic insulating layer) obtained before the gate electrode was formed, the element concentration change in the depth direction was determined. As a result, it was proved that the CYTOP layer existed on the surface side of the film, while the poly(3-octylthiophene) layer existed on the quartz substrate side.

The organic FET produced herein had a mobility of 0.005 $cm^2/Vs$, while the ratio of ON current versus OFF current between the source and drain electrodes was $10^4$.

In Examples 1 to 6, each coating liquid was applied onto the substrate by the spin coating method. The coating liquid, however, can be applied using another method such as a screen printing method, an ink-jet method, a dip method, a brush coating method, a roll coater method, or a doctor blade method, for example.

INDUSTRIAL APPLICABILITY

The coating liquid of the present invention can be used as a material for forming a layered film in which an organic semiconductor layer and an organic insulating layer are stacked together. This coating liquid is used preferably as a material for forming a semiconductor layer and an insulating layer of a field effect transistor. Furthermore, the present invention is applicable to field effect transistors and electronic devices including the same. Particularly, the present invention is used preferably for field effect transistors that are formed on a flexible substrate such as, for instance, plastics and electronic devices including the same. Examples of the electric devices to which the present invention is applicable include organic electroluminescence displays, liquid crystal displays, and electronic paper.

The invention claimed is:

1. A method of manufacturing a field effect transistor including an organic semiconductor layer and an organic insulating layer that adjoins the organic semiconductor layer, the method comprising the steps of:
   (i) applying a coating liquid including a solvent as well as first and second organic molecules that have been dissolved in the solvent; and
   (ii) forming a first layer and a second layer by removing the solvent contained in the coating liquid that has been applied, the first layer containing the first organic molecule as its main component, and the second layer adjoining the first layer and containing the second organic molecule as its main component,
   wherein the first organic molecule is a semiconductor material or a precursor of a semiconductor material,
   the second organic molecule is an insulator material or a precursor of an insulator material,
   the first organic molecule and the second organic molecule are not compatible with each other, and
   one of the first organic molecule and the second organic molecule comprises at least one group selected from a hydrocarbon group and a fluorocarbon group, while the other comprises at least one polar group.

2. The manufacturing method according to claim 1, wherein the one of the first organic molecule and the second organic molecule comprises no polar group.

3. The manufacturing method according to claim 1, wherein the polar group is at least one selected from the group consisting of a hydroxyl group, a carboxyl group, and an amino group.

4. A method of manufacturing a field effect transistor including an organic semiconductor layer and an organic insulating layer that adjoins the organic semiconductor layer, the method comprising the steps of:
   (i) applying a coating liquid including a solvent as well as first and second organic molecules that have been dissolved in the solvent; and
   (ii) forming a first layer and a second layer by removing the solvent contained in the coating liquid that has been applied, the first layer containing the first organic molecule as its main component, and the second layer adjoining the first layer and containing the second organic molecule as its main component,
   wherein the first organic molecule is a semiconductor material or a precursor of a semiconductor material,
   the second organic molecule is an insulator material or a precursor of an insulator material,
   the first organic molecule and the second organic molecule are not compatible with each other, and
   one of the first organic molecule and the second organic molecule includes a hydrocarbon group but does not include a fluorocarbon group, while the other includes a fluorocarbon group.

5. A method of manufacturing a field effect transistor including an organic semiconductor layer and an organic insulating layer that adjoins the organic semiconductor layer, the method comprising the steps of:
   (i) applying a coating liquid including a solvent as well as first and second organic molecules that have been dissolved in the solvent; and
   (ii) forming a first layer and a second layer by removing the solvent contained in the coating liquid that has been applied, the first layer containing the first organic molecule as its main component, and the second layer adjoining the first layer and containing the second organic molecule as its main component,
   wherein the first organic molecule is a semiconductor material or a precursor of a semiconductor material,
   the second organic molecule is an insulator material or a precursor of an insulator material,
   the first organic molecule and the second organic molecule are not compatible with each other, and
   the first organic molecule is a pentacene derivative.

6. The manufacturing method according to claim 5, wherein the second organic molecule is polystyrene.

* * * * *